United States Patent
Lee (10) Patent No.: US 10,886,353 B2
(45) Date of Patent: Jan. 5, 2021

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventor: Hyeonbum Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/523,719

(22) Filed: Jul. 26, 2019

(65) Prior Publication Data

US 2020/0052058 A1 Feb. 13, 2020

(30) Foreign Application Priority Data

Aug. 8, 2018 (KR) .................... 10-2018-0092668

(51) Int. Cl.
| | |
|---|---|
| *G09G 3/30* | (2006.01) |
| *H01L 27/32* | (2006.01) |
| *H01L 51/56* | (2006.01) |
| *G06F 3/041* | (2006.01) |
| *G06F 3/044* | (2006.01) |
| *H01L 51/52* | (2006.01) |

(52) U.S. Cl.
CPC ........ *H01L 27/3272* (2013.01); *G06F 3/0412* (2013.01); *G06F 3/0443* (2019.05); *H01L 27/323* (2013.01); *H01L 51/56* (2013.01); *G06F 2203/04103* (2013.01); *H01L 27/3246* (2013.01); *H01L 51/5253* (2013.01)

(58) Field of Classification Search
CPC .......... G09G 3/30–3291; G06F 1/1643; G06F 1/169; G06F 1/1692; G06F 3/03547; G06F 3/041–0428; G06F 3/0488–04886; G06F 2200/1634; G06F 2200/0339; G06F 2200/04101; G06F 2200/04103–04113
See application file for complete search history.

(56) References Cited

U.S. PATENT DOCUMENTS

| | | |
|---|---|---|
| 2017/0207277 A1 | 7/2017 | Park |
| 2017/0373124 A1 | 12/2017 | Yang et al. |

(Continued)

FOREIGN PATENT DOCUMENTS

| | | |
|---|---|---|
| KR | 10-2017-0087556 A | 7/2017 |
| KR | 10-2018-0025389 A | 3/2018 |

(Continued)

*Primary Examiner* — Sanghyuk Park
(74) *Attorney, Agent, or Firm* — Lewis Roca Rothgerber Christie LLP (57) ABSTRACT

An organic light-emitting display apparatus has a display layer including a pixel defining layer that surrounds a light-emission region, a first non-light-emission region in the pixel defining layer, and a second non-light-emission region in the pixel defining layer and includes a spacer that is further formed on the pixel defining layer; a light shielding layer including a first black matrix and a second black matrix respectively shielding the first non-light-emission region and the second non-light-emission region and having different permittivities from each other; and a touch screen layer including a touch electrode arranged at a location corresponding to the first black matrix and the second black matrix.

20 Claims, 11 Drawing Sheets

(56) References Cited

U.S. PATENT DOCUMENTS

| | | | |
|---|---|---|---|
| 2018/0059837 A1 | 3/2018 | Kim et al. | |
| 2018/0061899 A1 | 3/2018 | Oh et al. | |
| 2018/0068156 A1 | 3/2018 | Jang et al. | |
| 2018/0182819 A1* | 6/2018 | Jo | G06F 3/0416 |
| 2018/0252862 A1* | 9/2018 | Shei | G06F 3/0412 |
| 2018/0321788 A1* | 11/2018 | Kimura | G02F 1/133512 |
| 2020/0110479 A1* | 4/2020 | Liu | G02F 1/1333 |

FOREIGN PATENT DOCUMENTS

| | | |
|---|---|---|
| KR | 10-2018-0026597 A | 3/2018 |
| KR | 10-2018-0033366 A | 4/2018 |

* cited by examiner

ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2018-0092668, filed on Aug. 8, 2018, in the Korean Intellectual Property Office, the disclosure of which is incorporated herein in its entirety by reference.

BACKGROUND

1. Field

One or more embodiments relate to organic light-emitting display apparatuses and methods of manufacturing the same, and more particularly, to an organic light-emitting display apparatus having a touch screen layer and a method of manufacturing the organic light-emitting display apparatus.

2. Description of the Related Art

Organic light-emitting display apparatuses generally include pixels each having a stacked structure including a pixel electrode as an anode, an opposite electrode as a cathode, and an emission layer between the pixel electrode and the opposite electrode. When holes and electrons, injected respectively from the anode and the cathode, recombine in the emission layer, light is emitted, thereby displaying an image.

A touch screen layer for a touch operation by a user, and a light shielding layer for shielding a region other than light-emission regions of the pixels, are arranged on a display layer on which the pixels are arranged.

The sensitivity of a touch electrode included in the touch screen layer is often not uniform over the entire surface of the touch screen layer, and some areas of the touch screen layer are relatively sensitive while some other areas are relatively insensitive. For example, there may be a big sensitivity difference between a region of the display layer in which a spacer is formed to safely seat a mask for forming the emission layer via deposition and the other region of the display layer. The difference in sensitivity is estimated as a phenomenon occurring when a difference in a gap between the opposite electrode formed on the spacer and the touch electrode increases between the two regions of the display layer. The difference in the gap is caused because the spacer protrudes higher than its surroundings.

In this case, the non-uniformity of the touch sensitivity hinders smooth touch operation of a user, and consequently products are likely to be defective.

The disclosure in this background section relates to the general state of the art, and may not constitute prior art.

SUMMARY

One or more embodiments include an organic light-emitting display apparatus improved to be able to efficiently address a difference between touch sensitivities of different regions caused by a spacer and the like, and a method of manufacturing the organic light-emitting display apparatus.

Additional aspects will be set forth in part in the description which follows and, in part, will be apparent from the description, or may be learned by practice of the presented embodiments.

According to one or more embodiments, an organic light-emitting display apparatus includes a display layer including a light-emission region, a pixel defining layer around the light emission region, a first non-light-emission region, and a second non-light-emission region in the pixel defining layer, wherein a spacer is on the pixel defining layer at the second non-light-emission region; a light shielding layer including a first black matrix shielding the first non-light-emission region and a second black matrix shielding the second non-light-emission region; and a touch screen layer including a touch electrode arranged at a location corresponding to the first black matrix and the second black matrix, wherein the first black matrix and the second black matrix have different permittivities from each other.

The touch screen layer may be on the display layer, and the light shielding layer may be on the touch screen layer. The permittivity of the second black matrix may be greater than the permittivity of the first black matrix.

The light shielding layer may be on the display layer, and the touch screen layer may be on the light shielding layer. The permittivity of the first black matrix may be greater than the permittivity of the second black matrix.

The light shielding layer may further include a transparent organic layer that covers the light-emission region.

The transparent organic layer may cover the first black matrix and the second black matrix.

The transparent organic layer may cover the first black matrix and may not cover the second black matrix.

The organic light-emitting display apparatus may further include a moisture barrier layer that covers the display layer.

The display layer may include an emission layer arranged in the light-emission region, and a pixel electrode and an opposite electrode arranged opposite to each other with the emission layer between the pixel electrode and the opposite electrode. The opposite electrode may be on all of the light-emission region, the first non-light-emission region, and the second non-light-emission region.

According to one or more embodiments, a method of manufacturing an organic light-emitting display apparatus includes forming a display layer including a light-emission region, a pixel defining layer around the light-emission region, a first non-light-emission region in which a pixel defining layer that surrounds the light-emission region is in the pixel defining layer, and a second non-light-emission region is in the pixel defining layer, and a spacer is on the pixel defining layer at the second non-light-emission region; forming a light shielding layer including a first black matrix and a second black matrix respectively shielding the first non-light-emission region and the second non-light-emission region, wherein the first black matrix and the second black matrix have different permittivities from each other; and forming a touch screen layer including a touch electrode at a location corresponding to the first black matrix and the second black matrix.

The touch screen layer may be on the display layer, and the light shielding layer may be on the touch screen layer. The permittivity of the second black matrix may be greater than the permittivity of the first black matrix.

The light shielding layer may be on the display layer, and the touch screen layer may be on the light shielding layer. The permittivity of the first black matrix may be greater than the permittivity of the second black matrix.

The method may further include forming, in the light shielding layer, a transparent organic layer that covers the light-emission region.

The transparent organic layer may cover the first black matrix and the second black matrix.

The transparent organic layer may cover the first black matrix and may not cover the second black matrix.

The method may further include forming a moisture barrier layer covering the display layer.

The display layer may include an emission layer in the light-emission region, and a pixel electrode and an opposite electrode arranged opposite to each other with the emission layer between the pixel electrode and the opposite electrode. The opposite electrode may be formed over the light-emission region, the first non-light-emission region, and the second non-light-emission region.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
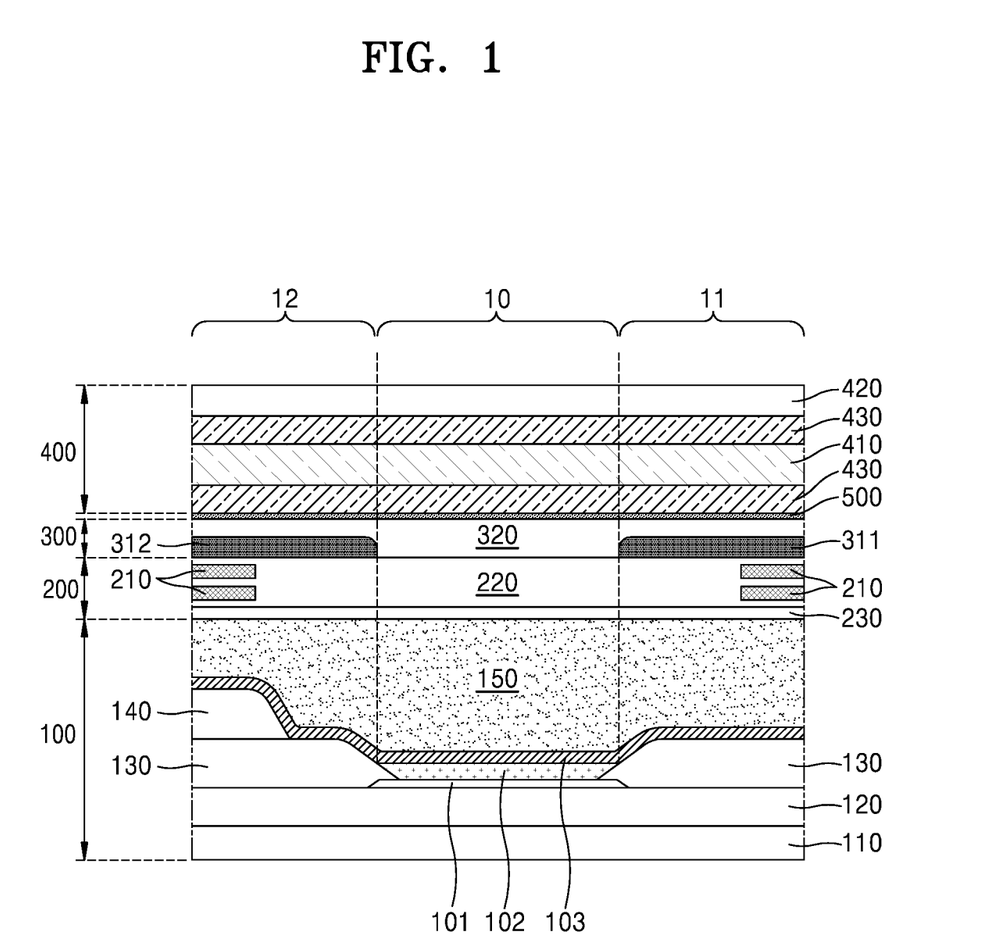
FIG. 1 is a cross-sectional view of an organic light-emitting display apparatus according to an embodiment of the present disclosure.

FIG. 1 is a cross-sectional view of an organic light-emitting display apparatus according to an embodiment of the present disclosure. Although FIG. 1 illustrates only a single organic light-emitting device (OLED), in various embodiments, a plurality of OLEDs are distributed in a product.

As shown in FIG. 1, the organic light-emitting display apparatus includes a display layer 100 on which an image may be displayed, a touch screen layer 200 for touch operation, a light shielding layer 300 for shielding first and second non-light-emission regions 11 and 12 (e.g., regions other than a light-emission region 10) by using first and second black matrices 311 and 312 in order black levels are improved, and a window layer 400 being an outermost protection layer.

In various embodiments, the display layer 100 includes an OLED having a pixel electrode 101, an emission layer 102, and an opposite electrode 103 arranged on an insulating layer 120 on a substrate 110, the light-emission region 10 of the OLED is bordered (e.g., surrounded) by a pixel defining layer 130, and spacers 140 are intermittently formed on the pixel defining layer 130. A thin film encapsulation layer 150 covers an upper surface of the OLED.

In various embodiments, the pixel defining layer 130 defines the light-emission regions (e.g., light-emission region 10) of OLED pixels, and the spacer 140 serves as a support for a deposition mask when the emission layer 102 is formed via deposition.

A non-light-emission region including the pixel defining layer 130 without the spacer 140 is referred to as the first non-light-emission region 11, and a non-light-emission region including both the spacer 140 and the pixel defining layer 130 is referred to as the second non-light-emission region 12.

The substrate 110 includes a thin film transistor and a capacitor connected to the OLED. However, for convenience of explanation, illustrations of the thin film transistor and the capacitor have been omitted.

In various embodiments, the touch screen layer 200 arranged on the display layer 100 includes an organic layer 220 being a base layer, a touch electrode 210 arranged within the organic layer 220, and a buffer layer 230 formed of SiNx or other suitable compound. In various embodiments, the touch screen layer 200 is not previously manufactured as a separate component and then attached, but is instead formed using a film-formation process, similar to the display layer 100.

In various embodiments, the light shielding layer 300 on the touch screen layer 200 includes the first black matrix 311 for shielding the first non-light-emission region 11, the second black matrix 312 for shielding the second non-light-emission region 12, and a transparent organic layer 320 covering both the first and second black matrices 311 and 312 and also the light-emission region 10. The first and second black matrices 311 and 312 provide clear black visibility when not in use by shielding the first and second non-light-emission regions 11 and 12 (but not the light-emission region 10). The transparent organic layer 320 covers the light-emission region 10 and is formed of a suitable transparent material (e.g., a material that does not affect light emission).

In various embodiments, the window layer 400, being an outermost layer, includes a polarization layer 410, a window 420, and one or more adhesion layers 430. A moisture barrier layer 500 prevents moisture from penetrating into the display layer 100. The moisture barrier layer 500 may be formed of, for example, a hydrophobic material like fluorinated silane-based promoter, a fluorinated acryl-based monomer, a fluorinated alkyl-based material, or other suitable material.

In various embodiments, the first black matrix 311 and the second black matrix 312 of the light shielding layer 300 have different permittivities. The different permittivities may cause a difference in the influences of the first non-light-emission region 11 and the second non-light-emission region 12 upon the touch screen layer 200.

In other words, the first non-light-emission region 11 includes the pixel defining layer 130, while the second non-light-emission region 12 includes both the pixel defining layer 130 and the spacer 140. The spacer 140 causes the gap between the opposite electrode 103 and the touch electrode 140 to not be uniform because only the pixel defining layer 130 is arranged in the first non-light-emission region 11 of the display layer 100 while both the pixel defining layer 130 and the spacer 140 are arranged in the second non-light-emission region 12 of the display layer 100, (e.g., a gap between the opposite electrode 103 and the touch electrode 210 in the first non-light-emission region 11 is different (e.g., greater) from that in the second non-light-emission region 12), which effects the operation of the touch screen layer 200. Because the opposite electrode 103 of the OLED is not only arranged opposite to the pixel electrode 101 with the emission layer 102 therebetween in the light-emission region 10, but is also arranged on the pixel defining layer 130 and the spacer 140 in the first and second non-light-emission regions 11 and 12, a gap between the opposite electrode 103 and the touch electrode 210 is smaller in a region including the spacer 140 than in a region including only the pixel defining layer 130. A difference between influences of the opposite electrode 103 upon the touch electrode 210 in the above two regions is generated, leading to a deviation in the sensitivity of a touch operation in the two regions. For example, the second non-light-emission region 12 in which the opposite electrode 103 and the touch electrode 210 are relatively close to each other provides less sensitivity than the first non-light-emission region 11 where the opposite electrode 103 and the touch electrode 210 are relatively far from each other. The difference in sensitivity is estimated to be generated due to an influence of a parasitic capacitance between the opposite electrode 103 and the touch electrode 210.

According to an embodiment, the first black matrix 311 and the second black matrix 312 located in the light shielding layer 300 on the touch screen layer 200 may have different permittivities.

According to an embodiment, as shown in Table 1 below, as the permittivities of the first and second black matrices 311 and 312 increase, sensitivity of the touch electrode 210 increases. In Table 1, S/N indicates a signal-to-noise ratio of the touch electrode 210.

TABLE 1

| Permittivity (k) | 2 | 3 | 4 | 10 | 50 |
|---|---|---|---|---|---|
| S/N | 14.24 | 14.55 | 14.86 | 15.15 | 15.42 |

Thus, according to the present embodiment, the second black matrix 312 of the second non-light-emission region 12 may have a higher permittivity than the first black matrix 311 of the first non-light-emission region 11 to compensate for the relatively small touch sensitivity of the second non-light-emission region 12.

In various embodiments, the difference between the touch sensitivities of the first and second non-light-emission regions 11 and 12 due to the spacer 140 may be compensated for by adjusting the permittivities of the first and second black matrices 311 and 312, and the touch sensitivities of the first and second non-light-emission regions 11 and 12 may be amended to be uniform.

As such, the different touch sensitivities of the first and second non-light-emission regions 11 and 12 may be amended to be uniform by differently setting the permittivities of the first and second black matrices 311 and 312 of the light shielding layer 300, and consequently, stable and uniform touch operation is secured.

Figure 2A:
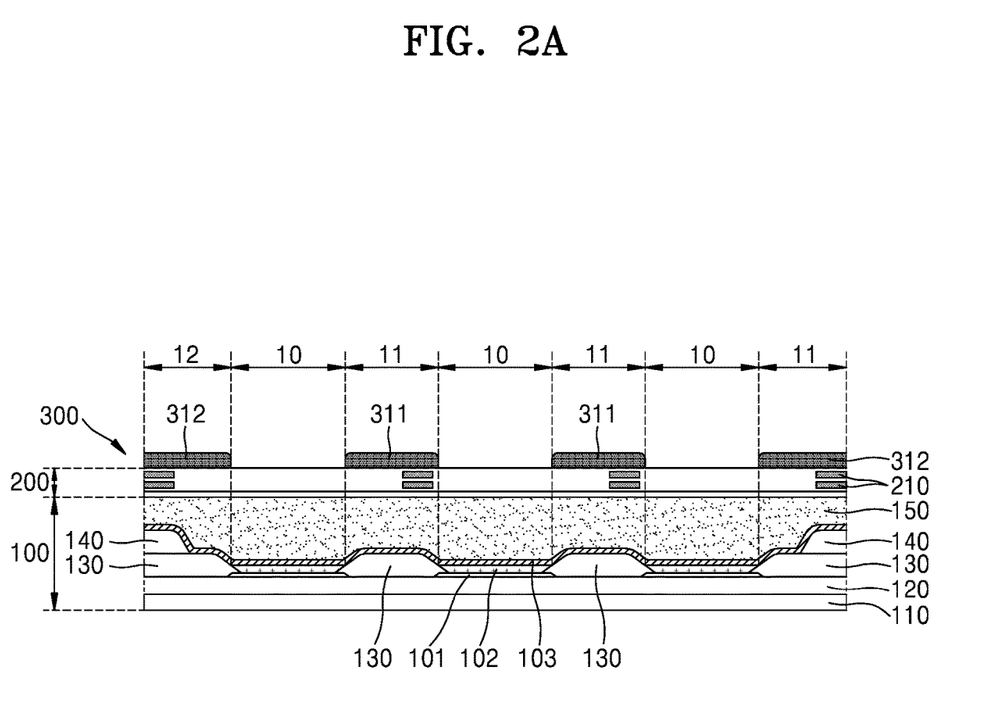
FIGS. 2A-2C are cross-sectional views for illustrating a method of manufacturing the organic light emitting display apparatus shown in FIG. 1.
Figure 2B:
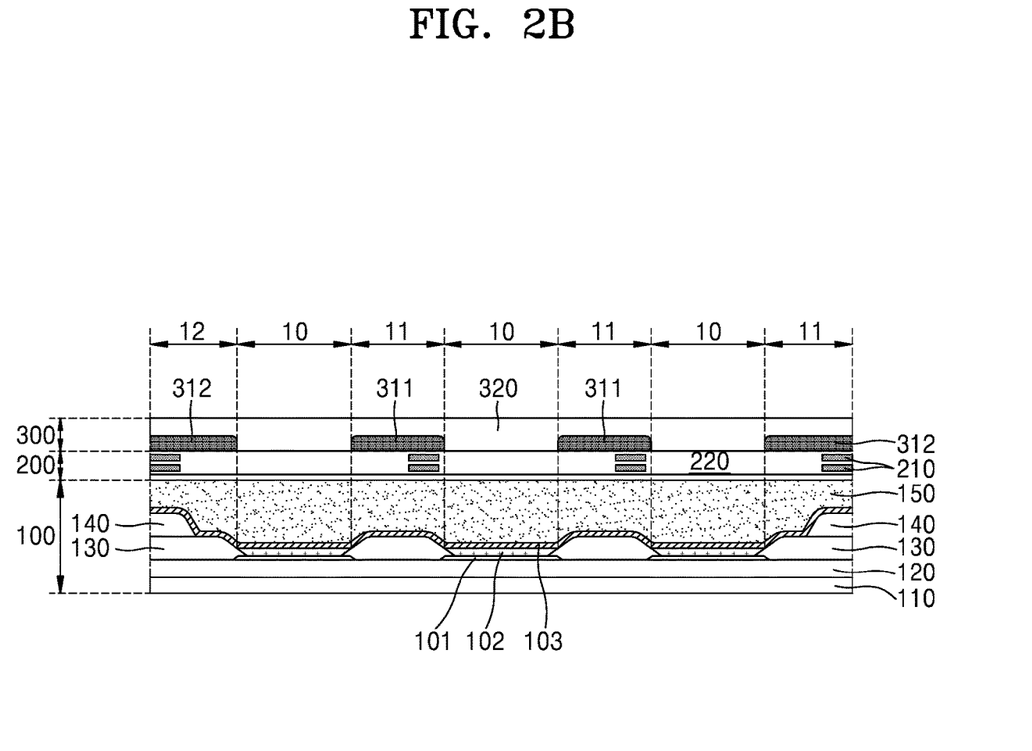
Figure 2C:
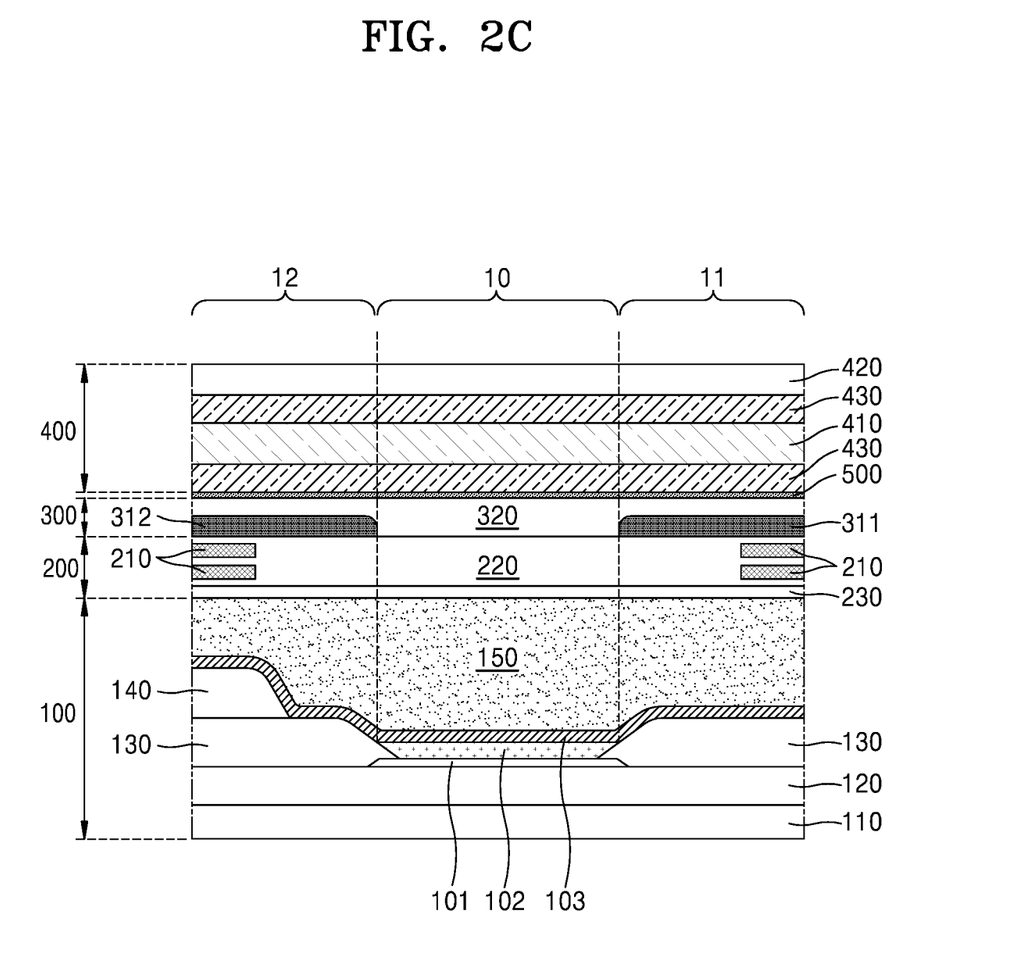

An organic light-emitting display apparatus including such a light shielding layer 300 may be manufactured as shown in FIGS. 2A-2C.

Referring to FIG. 2A, the touch screen layer 200 is formed on the display layer 100, and the first and second black matrices 311 and 312 may be independently formed on the touch screen layer 200 via a photoresist process, an inkjet process, or any other suitable process as those skilled in the art would appreciate. In various embodiments, the second black matrix 312 is formed using a material having a larger permittivity than the first black matrix 311.

Referring to FIG. 2B, the transparent organic layer 320 covers a resultant structure of FIG. 2A. Referring to FIG. 2C, the moisture barrier layer 500 and the window layer 400 are formed on the transparent organic layer 320.

Because the different touch sensitivities of the first and second non-light-emission regions 11 and 12 are amended to be uniform by forming the light shielding layer 300 of which the first and second black matrices 311 and 312 have different permittivities as described above, a stable and uniform touch operation may be secured, and performance and reliability may be improved.

Figure 3:
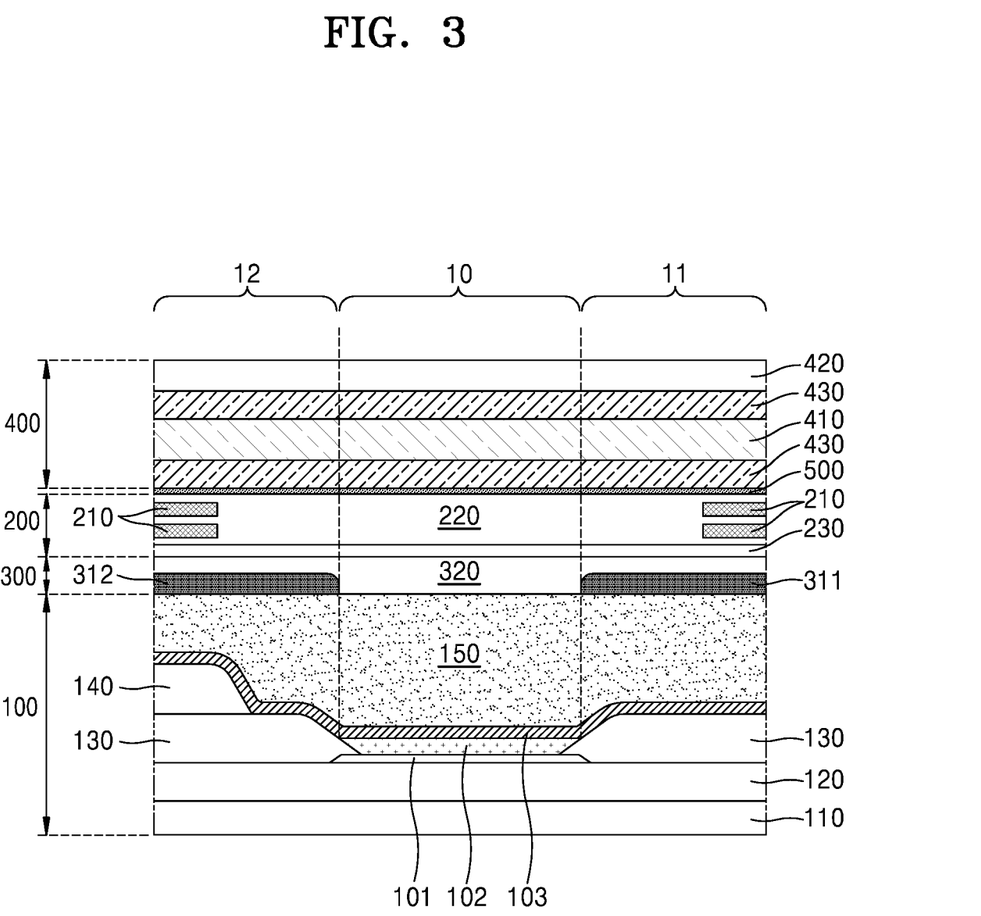
FIG. 3 is a cross-sectional view of an organic light-emitting display apparatus according to another embodiment of the present disclosure.

FIG. 3 is a cross-sectional view of an organic light-emitting display apparatus according to another embodiment.

In one embodiment, the first and second black matrices 311 and 312 of the light shielding layer 300 have different permittivities. However, compared with the structure of FIG. 1, the order in which the light shielding layer 300 and the touch screen layer 200 are stacked is different. Such a structure in which the light shielding layer 300 is arranged close to the display layer 100 provides a favorable viewing angle when compared to the arrangement of FIG. 1. However, because the touch electrode 210 of the touch screen layer 200 is seen through the window layer 400, this structure is somewhat unfavorable in terms of black visibility.

In other words, in the structure of FIG. 1, because the first and second black matrices 311 and 312 of the light shielding layer 300 shield the first and second non-light-emission regions 11 and 12 and also shield the touch electrode 210 of the touch screen layer 200, black visibility is improved. However, because a gap between the emission layer 102, being a light source, and the light shielding layer 300 is increased by intervention of the touch screen layer 200, a viewing angle is relatively narrowed.

However, in the structure of FIG. 3, because the gap between the emission layer 102 and the light shielding layer 300 is decreased, the viewing angle is widened similar to a wide angle lens. However, as described above, because the touch screen layer 200 is seen through the window layer 400, black visibility may be degraded.

The two structures of FIGS. 1 and 3 may be selectively employed according to application (e.g., necessary options due to the merits and demerits of each design). Similar to the structure of FIG. 1, in the structure of FIG. 3, a difference in touch sensitivity may be amended by differently setting the permittivities of the first and second black matrices 311 and 312.

In various embodiments, when the light shielding layer 300 is between the display layer 100 and the touch screen layer 200 as in the structure of FIG. 3, an experiment result of Table 2 below shows that as the permittivities of the first and second black matrices 311 and 312 decrease, sensitivity of the touch electrode 210 improves.

TABLE 2

| Permittivity (k) | 2 | 3 | 4 | 10 | 50 |
|---|---|---|---|---|---|
| S/N | 17.46 | 17.45 | 17.43 | 17.38 | 17.28 |

Thus, in the structure according to the present embodiment, the second black matrix 312 of the second non-light-emission region 12 having relatively small touch sensitivity may be constructed with a material that has a smaller permittivity than the first black matrix 311 of the first non-light-emission region 11. In other words, the permittivity of the first black matrix 311 is set to be larger than that of the second black matrix 312.

In this case, similar to the structure of FIG. 1, the difference between the touch sensitivities of the first and second non-light-emission regions 11 and 12 due to the spacer 140 is compensated by the difference between the permittivities of the first and second black matrices 311 and 312, and the different touch sensitivities of the first and second non-light-emission regions 11 and 12 are amended to be uniform.

As such, the different touch sensitivities of the first and second non-light-emission regions 11 and 12 are amended to be uniform by differently setting the permittivities of the first and second black matrices 311 and 312 of the light shielding layer 300, and consequently, a stable and uniform touch operation is secured.

Figure 4:
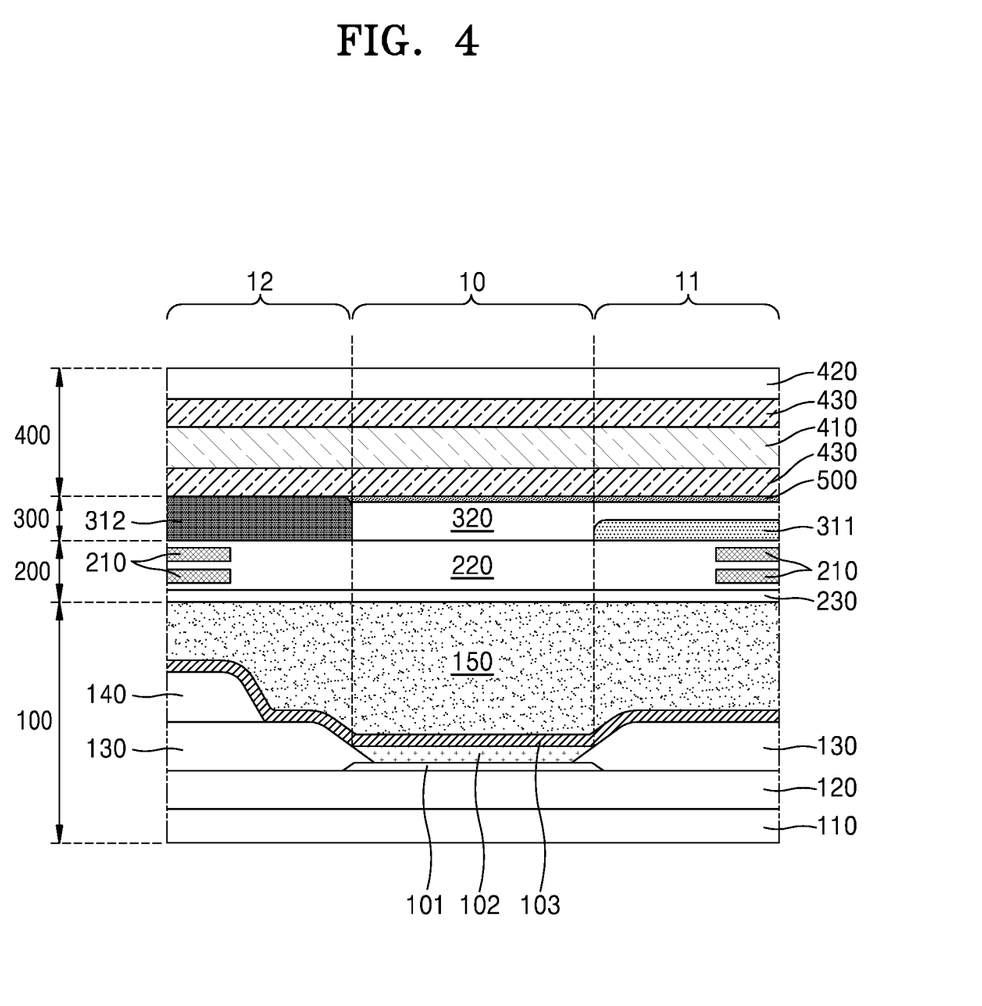
FIG. 4 is a cross-sectional view of an organic light-emitting display apparatus according to another embodiment of the present disclosure.

FIG. 4 is a cross-sectional view of an organic light-emitting display according to another embodiment. The present embodiment is similar to the structure of FIG. 1, and the permittivity of the second black matrix 312 may also be larger than that of the first black matrix 311.

In an embodiment, the transparent organic layer 320 does not need to be formed on the entire region of the light shielding layer 300. In other words, the first black matrix 311 is covered by the transparent organic layer 320, but the second black matrix 312 is not covered by the transparent organic layer 320 and has almost the same thickness as that of the transparent organic layer 320.

This structure may be manufactured as shown in FIGS. 5A-5D.

Figure 5A:
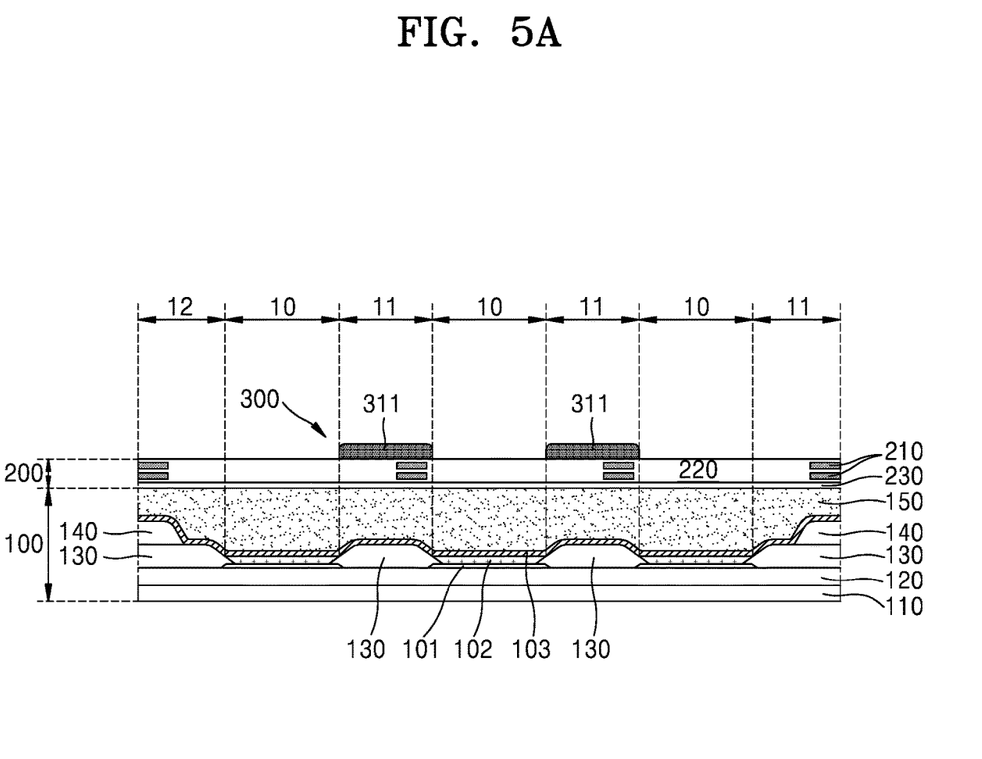
FIGS. 5A-5D are cross-sectional views for illustrating a method of manufacturing the organic light emitting display apparatus shown in FIG. 4.

As shown in FIG. 5A, the touch screen layer 200 is formed on the display layer 100, and then the first black matrix 311 is formed (e.g., using a photoresist process or other suitable process) in the first non-light-emission region 11.

Figure 5B:
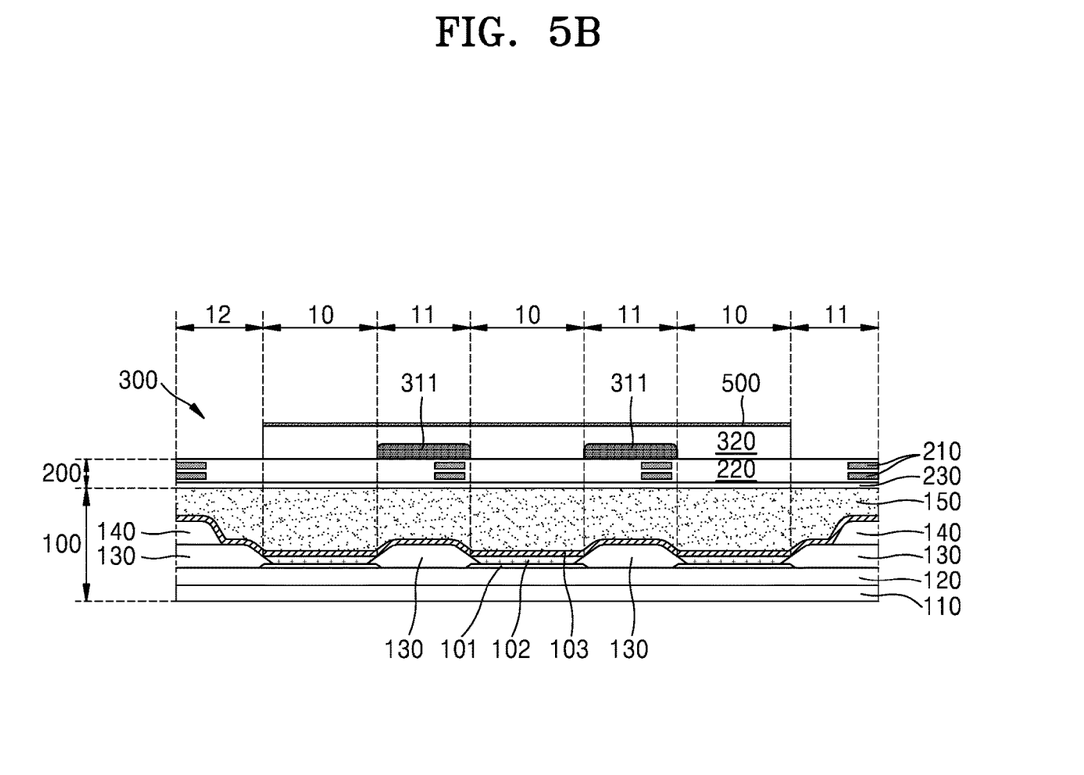

As shown in FIG. 5B, the transparent organic layer 320 and the moisture barrier layer 500 are formed in the light-emission region 10 and the first non-light-emission region 11.

Figure 5C:
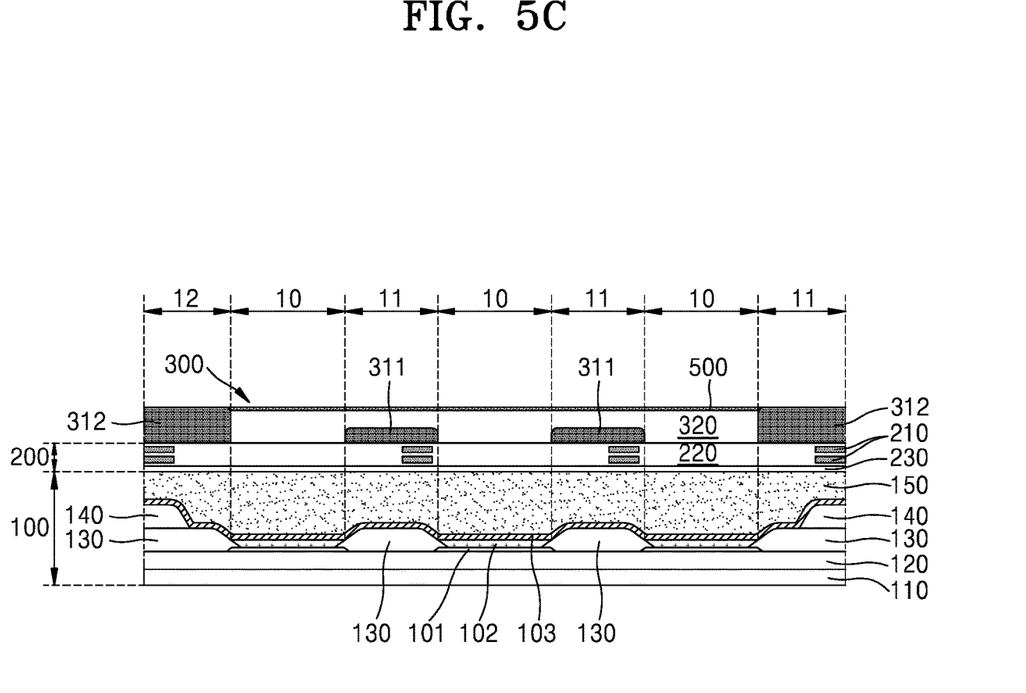

As shown in FIG. 5C, the second black matrix 312 is formed (e.g., formed using an inkjet process) in the second non-light-emission region 12. The second black matrix 312 is formed using a material having a larger permittivity than the first black matrix 311.

Figure 5D:
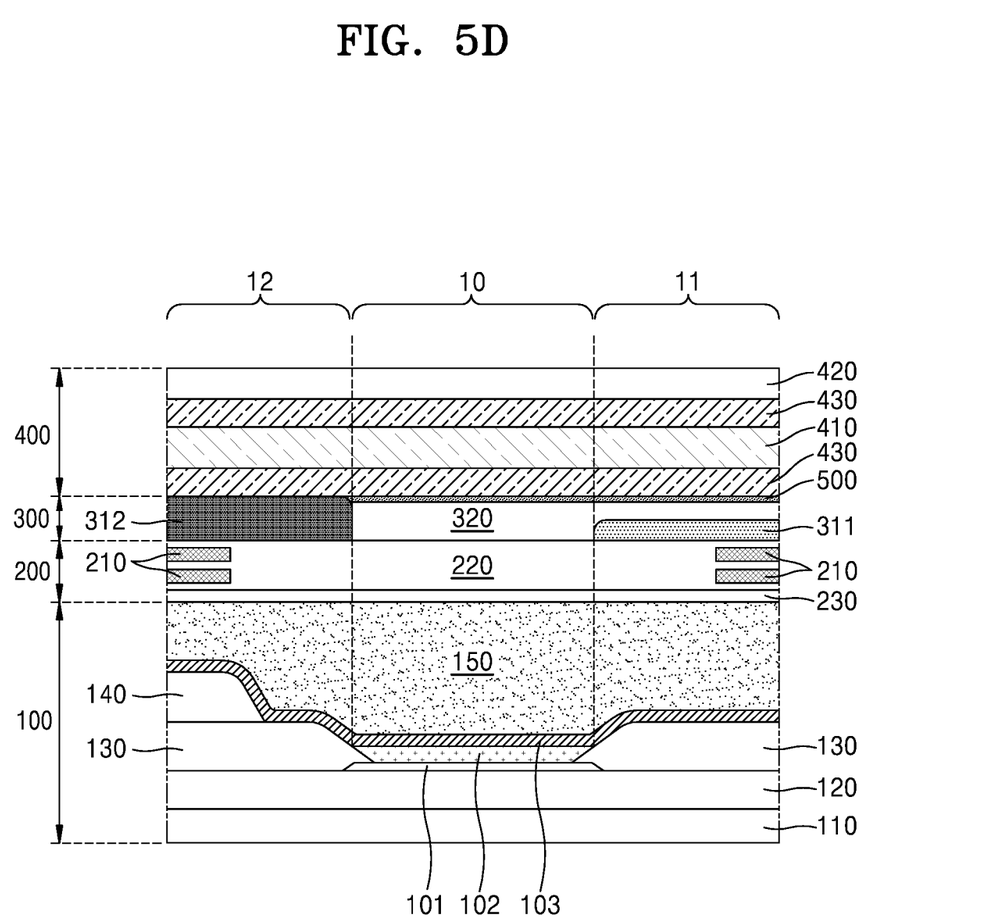

Then, as shown in FIG. 5D, the window layer 400 is formed on a resultant structure.

In the present embodiment, the different touch sensitivities of the first and second non-light-emission regions 11 and 12 are amended to be uniform by forming the light shielding layer 300 of which the first and second black matrices 311 and 312 have different permittivities, thereby realizing a structure that secures a stable and uniform touch operation.

Figure 6:
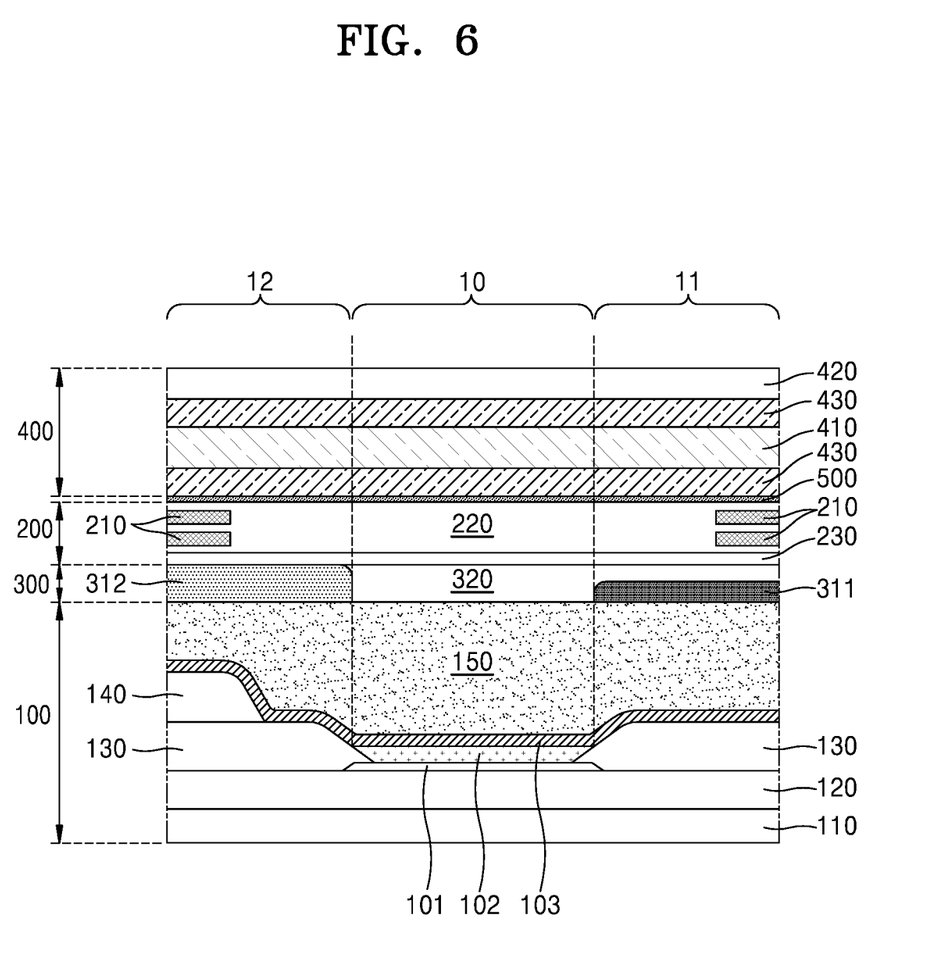
FIG. 6 is a cross-sectional view of an organic light-emitting display apparatus according to another embodiment of the present disclosure.

FIG. 6 is a cross-sectional view of an organic light-emitting display apparatus according to another embodiment.

The present embodiment is similar to the structure of FIG. 3, and is also similar to the structure of FIG. 3 in that the permittivity of the first black matrix 311 is larger than that of the second black matrix 312.

In the present embodiment, the transparent organic layer 320 covers the first black matrix 311, but does not cover the second black matrix 312, and the second black matrix 312 and the transparent organic layer 320 have almost the same thickness. In other words, as in FIG. 4, the transparent organic layer 320 does not need to be formed on the entire region of the light shielding layer 300.

Accordingly, in the present embodiment, the different touch sensitivities of the first and second non-light-emission regions 11 and 12 may be amended to be uniform by forming the light shielding layer 300 of which the first and second black matrices 311 and 312 have different permittivities, thereby realizing a structure that secures a stable and uniform touch operation.

As described above, according to organic light-emitting display apparatuses and methods of manufacturing the same according to embodiments of the present disclosure, a problem occurring due to a difference between touch sensitivities of different regions is addressed by differently setting the permittivity of the light shielding layer, to thereby smoothen a touch operation. Consequently, performance and reliability of a product may improve.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. An organic light-emitting display apparatus comprising:
    a display layer having a light-emission region, a pixel defining layer around the light emission region, a first non-light-emission region in the pixel defining layer, and a second non-light-emission region in the pixel defining layer, wherein a spacer is on the pixel defining layer at the second non-light-emission region;
    a light shielding layer comprising a first black matrix shielding the first non-light-emission region and a second black matrix shielding the second non-light-emission region; and
    a touch screen layer comprising a touch electrode arranged at a location corresponding to the first black matrix and the second black matrix,
    wherein the first black matrix and the second black matrix have different permittivities from each other.

2. The organic light-emitting display apparatus of claim 1, wherein the touch screen layer is on the display layer, and the light shielding layer is on the touch screen layer.

3. The organic light-emitting display apparatus of claim 2, wherein the permittivity of the second black matrix is greater than the permittivity of the first black matrix.

4. The organic light-emitting display apparatus of claim 1, wherein the light shielding layer is on the display layer, and the touch screen layer is on the light shielding layer.

5. The organic light-emitting display apparatus of claim 4, wherein the permittivity of the first black matrix is greater than the permittivity of the second black matrix.

6. The organic light-emitting display apparatus of claim 1, wherein the light shielding layer further comprises a transparent organic layer that covers the light-emission region.

7. The organic light-emitting display apparatus of claim 6, wherein the transparent organic layer covers the first black matrix and the second black matrix.

8. The organic light-emitting display apparatus of claim 6, wherein the transparent organic layer covers the first black matrix and does not cover the second black matrix.

9. The organic light-emitting display apparatus of claim 1, further comprising a moisture barrier layer covering the display layer.

10. The organic light-emitting display apparatus of claim 1, wherein
    the display layer comprises an emission layer in the light-emission region, and a pixel electrode and an opposite electrode arranged opposite to each other with the emission layer between the pixel electrode and the opposite electrode, and
    the opposite electrode is on all of the light-emission region, the first non-light-emission region, and the second non-light-emission region.

11. A method of manufacturing an organic light-emitting display apparatus, the method comprising:
    forming a display layer comprising a light-emission region, a pixel defining layer around the light-emission region, a first non-light-emission region in the pixel defining layer, and a second non-light-emission region in the pixel defining layer, wherein a spacer is on the pixel defining layer at the second non-light-emission region;
    forming a light shielding layer comprising a first black matrix and a second black matrix respectively shielding the first non-light-emission region and the second non-light-emission region, wherein the first black matrix and the second black matrix have different permittivities from each other; and
    forming a touch screen layer comprising a touch electrode at a location corresponding to the first black matrix and the second black matrix.

12. The method of claim 11, wherein the touch screen layer is on the display layer, and the light shielding layer is on the touch screen layer.

13. The method of claim 12, wherein the permittivity of the second black matrix is greater than the permittivity of the first black matrix.

14. The method of claim 11, wherein the light shielding layer is on the display layer, and the touch screen layer is on the light shielding layer.

15. The method of claim 14, wherein the permittivity of the first black matrix is greater than the permittivity of the second black matrix.

16. The method of claim 11, further comprising forming, in the light shielding layer, a transparent organic layer that covers the light-emission region.

17. The method of claim 16, wherein the transparent organic layer covers the first black matrix and the second black matrix.

18. The method of claim 16, wherein the transparent organic layer covers the first black matrix and does not cover the second black matrix.

19. The method of claim 11, further comprising forming a moisture barrier layer covering the display layer.

20. The method of claim 11, wherein
- the display layer comprises an emission layer in the light-emission region, and a pixel electrode and an opposite electrode arranged opposite to each other with the emission layer between the pixel electrode and the opposite electrode, and
- the opposite electrode is formed over the light-emission region, the first non-light-emission region, and the second non-light-emission region.

\* \* \* \* \*